(12) United States Patent
Lin et al.

(10) Patent No.: US 10,827,647 B2
(45) Date of Patent: Nov. 3, 2020

(54) LIQUID-COOLING DEVICE

(71) Applicant: Coretronic Corporation, Hsin-Chu (TW)

(72) Inventors: Shi-Wen Lin, Hsin-Chu (TW); Tsung-Ching Lin, Hsin-Chu (TW); Wei-Chi Liu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 35 days.

(21) Appl. No.: 16/361,229

(22) Filed: Mar. 22, 2019

(65) Prior Publication Data
US 2019/0364694 A1 Nov. 28, 2019

(30) Foreign Application Priority Data
May 24, 2018 (CN) .......................... 2018 1 0505397

(51) Int. Cl.
*H05K 7/20* (2006.01)
*F28F 3/02* (2006.01)
*G03B 21/16* (2006.01)

(52) U.S. Cl.
CPC ......... *H05K 7/20263* (2013.01); *F28F 3/025* (2013.01); *G03B 21/16* (2013.01); *H05K 7/20272* (2013.01)

(58) Field of Classification Search
CPC ............ H05K 7/20263; H05K 7/20272; H01L 23/473; H01L 23/4735; G03B 21/16; F28F 3/025; F28F 9/0212; F28F 9/026; F28F 9/0265; F28F 9/0268; F28F 2009/0292; F28F 2009/226; F28F 27/02; F28F 2215/04; F28F 2250/102; F28D 2021/0028; F28D 2021/0029; F21V 29/56
See application file for complete search history.

(56) References Cited

U.S. PATENT DOCUMENTS

| | | | |
|---|---|---|---|
| 4,420,739 A * | 12/1983 | Herren ................. | F28D 9/0043 338/53 |
| 5,309,319 A | 5/1994 | Messina | |
| 5,441,102 A * | 8/1995 | Burward-Hoy ....... | F28D 1/0325 165/104.22 |
| 7,035,104 B2 * | 4/2006 | Meyer ..................... | F28F 3/12 165/104.33 |

(Continued)

FOREIGN PATENT DOCUMENTS

| | | |
|---|---|---|
| CN | 208459759 | 2/2019 |
| TW | M394501 | 12/2010 |

(Continued)

*Primary Examiner* — Jianying C Atkisson
*Assistant Examiner* — Jose O Class-Quinones
(74) *Attorney, Agent, or Firm* — JCIPRNET

(57) ABSTRACT

The invention provides a liquid-cooling device, including a shell, wherein the shell includes a top plate, a bottom plate, a front plate, a rear plate and two opposite side plates, and form an accommodating space. At least one water inlet pipe is disposed on the top plate of the shell and communicates with the accommodating space. At least one water outlet pipe is disposed on the front plate of the shell and communicates with the accommodating space. A plurality of heat-dissipating fins is disposed in the accommodating space. A partition plate is disposed in the accommodating space. The partition plate forms at least two flow passages in the accommodating space.

18 Claims, 4 Drawing Sheets

(56) References Cited

U.S. PATENT DOCUMENTS

| | | | | |
|---|---|---|---|---|
| 7,143,816 | B1* | 12/2006 | Ghosh | H01L 23/473 165/80.4 |
| 7,269,011 | B2* | 9/2007 | Bhatti | H01L 23/4336 165/80.4 |
| 7,597,135 | B2* | 10/2009 | Ghosh | H01L 23/4336 165/104.33 |
| 7,757,752 | B2 | 7/2010 | Egawa et al. | |
| 8,786,078 | B1* | 7/2014 | Rau | H05K 7/2029 165/80.4 |
| 9,439,325 | B2 | 9/2016 | Campbell et al. | |
| 2004/0066625 | A1* | 4/2004 | Meyer | F28F 3/12 361/699 |
| 2006/0219387 | A1* | 10/2006 | Atarashi | H01L 23/473 165/80.4 |
| 2006/0264073 | A1* | 11/2006 | Yang | H01L 23/473 439/72 |
| 2007/0039720 | A1* | 2/2007 | Ghosh | H01L 23/473 165/104.33 |
| 2007/0045044 | A1* | 3/2007 | Sullivan | F01N 1/083 181/268 |
| 2007/0125526 | A1* | 6/2007 | Satou | H01L 23/473 165/121 |
| 2007/0158050 | A1* | 7/2007 | Norley | H01L 24/29 165/80.4 |
| 2008/0029260 | A1* | 2/2008 | Hu | F28F 3/12 165/182 |
| 2008/0239671 | A1* | 10/2008 | Amano | H01L 23/3735 361/699 |
| 2011/0073292 | A1* | 3/2011 | Datta | F28F 1/40 165/157 |
| 2011/0299244 | A1* | 12/2011 | Dede | F28F 13/08 361/689 |
| 2012/0063091 | A1* | 3/2012 | Dede | H05K 7/20927 361/699 |
| 2012/0175094 | A1* | 7/2012 | Rice | F28D 1/03 165/170 |
| 2013/0343001 | A1* | 12/2013 | Kwak | H01L 23/473 361/717 |
| 2014/0252585 | A1* | 9/2014 | Chen | H01L 23/44 257/692 |
| 2014/0339693 | A1* | 11/2014 | Hotta | H01L 27/0629 257/714 |
| 2015/0102480 | A1* | 4/2015 | Nakagawa | H01L 23/3672 257/714 |
| 2015/0194363 | A1* | 7/2015 | Jun | H01L 21/3065 257/714 |
| 2015/0244044 | A1* | 8/2015 | Boddakayala | H01M 10/613 429/120 |
| 2017/0045307 | A1* | 2/2017 | Tsai | H01L 23/467 |
| 2018/0132388 | A1* | 5/2018 | Hayashi | H05K 7/20272 |
| 2018/0204784 | A1* | 7/2018 | Kawase | H01L 25/18 |
| 2018/0238642 | A1* | 8/2018 | Seki | H05K 7/20 |

FOREIGN PATENT DOCUMENTS

| | | |
|---|---|---|
| TW | M511640 | 11/2015 |
| TW | I589828 | 7/2017 |

* cited by examiner

LIQUID-COOLING DEVICE

CROSS-REFERENCE TO RELATED APPLICATION

This application claims the priority benefit of China application serial no. 201810505397.8, filed on May 24, 2018. The entirety of the above-mentioned patent application is hereby incorporated by reference herein and made a part of this specification.

BACKGROUND OF THE INVENTION

1. Field of the Invention

The invention relates to a liquid-cooling device, in particular, to a liquid-cooling device applied to a solid light source projector.

2. Description of Related Art

A traditional projector generally utilizes a high-pressure mercury lamp as a light source for projection, and in recent years, with the progress of the production of semiconductors, light sources made of semiconductor components such as light emitting diodes or lasers have already been developed. The light sources made of the semiconductor components have the advantages of small size, high light brightness and the like. However, the small-sized light source has the defect of the high heat density of the semiconductor component, so the semiconductor component has higher requirement on a heat dissipation function.

At present, a water-cooling heat-dissipating module is adhered to a heat source to dissipate heat, so that cooling water is enabled to flow into the heat-dissipating module to absorb the waste heat and to dissipate the waste heat to external air in manners such as conduction and convection. However, the existing water-cooling heat-dissipating module generally adopts a heat-dissipating fin formed by punching a metal sheet, the cooling water enters the heat-dissipating module to contact the heat-dissipating fin, the temperature of the cooling water increases along with the increase of a flow distance, due to the poor heat conduction effect of the metal sheet, when the cooling water flows to a rear end of the fin, the cooling water is already heated up, and the heat conduction performance of the heat-dissipating fin is already greatly reduced. Therefore, a partial area of the heat source cannot dissipate the heat effectively, which affects the operation of the semiconductor light source.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY OF THE INVENTION

The invention is directed to a liquid-cooling device which may improve the heat conduction performance between cooling liquid and a heat-dissipating fin.

A liquid-cooling device of the invention includes a shell, wherein the shell includes a top plate, a bottom plate, a front plate, a rear plate and two opposite side plates, and the top plate, the bottom plate, the front plate, the rear plate and the two side plates form an accommodating space. At least one water inlet pipe is disposed on the top plate of the shell and communicated with the accommodating space. At least one water outlet pipe is disposed on the front plate of the shell and communicated with the accommodating space. A plurality of heat-dissipating fins is disposed in the accommodating space. A partition plate is disposed in the accommodating space, and the partition plate forms at least two flow passages in the accommodating space. A liquid-cooling device of the invention includes a shell, wherein the shell includes a top plate, a bottom plate, a front plate, a rear plate and two opposite side plates, and the top plate, the bottom plate, the front plate, the rear plate and the two side plates form an accommodating space. At least one water inlet pipe is disposed on the top plate of the shell and communicated with the accommodating space. Two water outlet pipes are disposed on the front plate of the shell and communicated with the accommodating space. A plurality of heat-dissipating fins is disposed in the accommodating space.

Based on the above, according to the liquid-cooling device of the invention, the angle of 70 degrees to 110 degrees is provided between the axial direction of at least one water outlet pipe and the axial direction of the at least one water inlet pipe, therefore, when cooling liquid enters the shell from at least one water inlet pipe, an impact cooling effect can be produced on a part of the bottom plate of the shell, thereby improving the heat dissipation effect. In addition, by configuring at least two flow passages, the cooling liquid is better distributed when in flow, so that the cooling liquid rapidly passes through each of the plurality of heat-dissipating fins and bring away waste heat, and the heated-up cooling liquid finally leaves the shell via the at least one water outlet pipe, thereby achieving an objective of improving the heat conduction performance of the liquid-cooling device.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
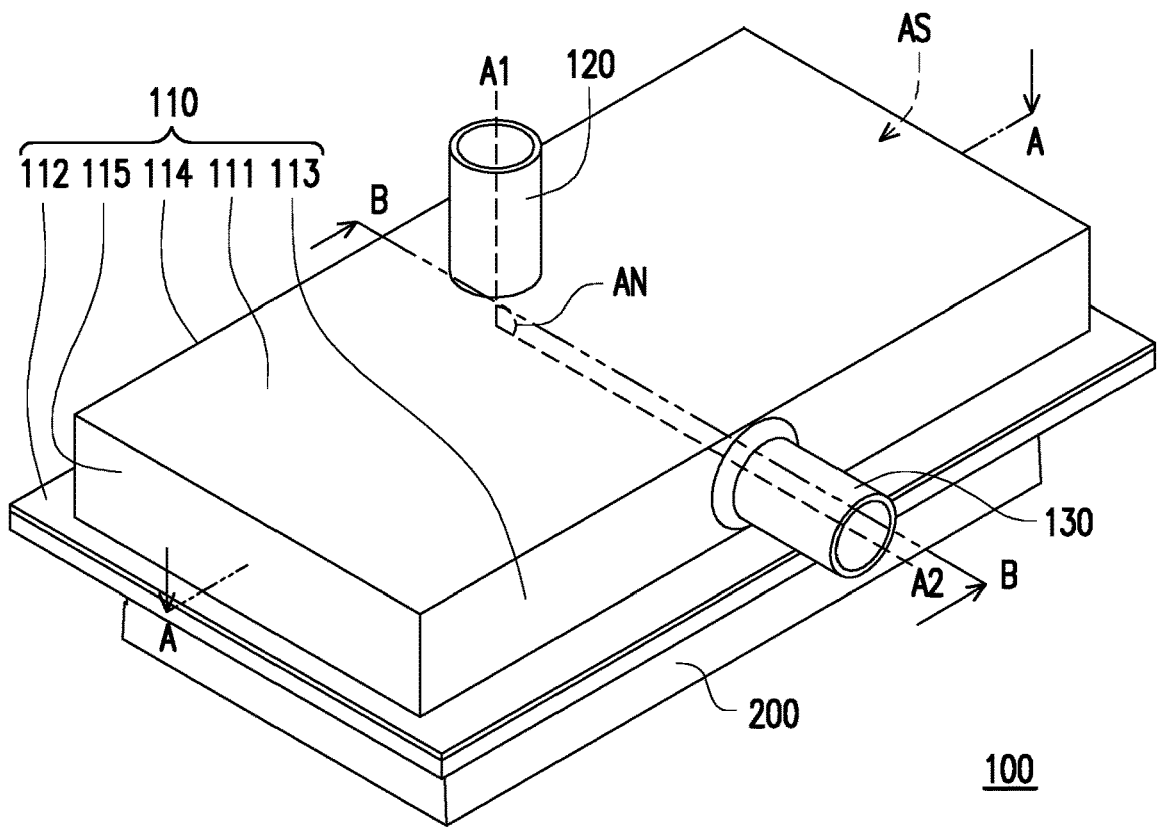
FIG. 1A is an appearance schematic diagram of a liquid-cooling device according to one embodiment of the invention.
Figure 1B:
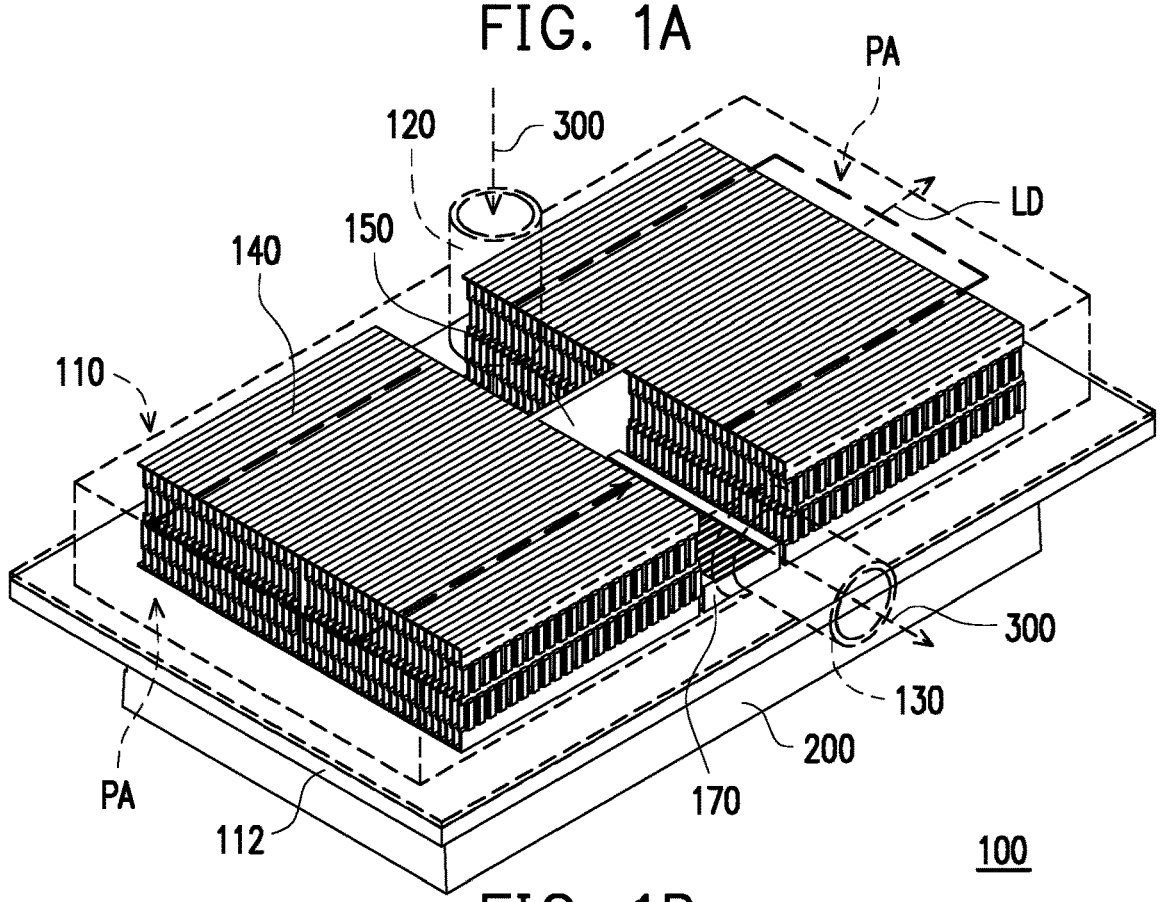
FIG. 1B illustrates a perspective schematic diagram of the liquid-cooling device of FIG. 1A.
Figure 1C:
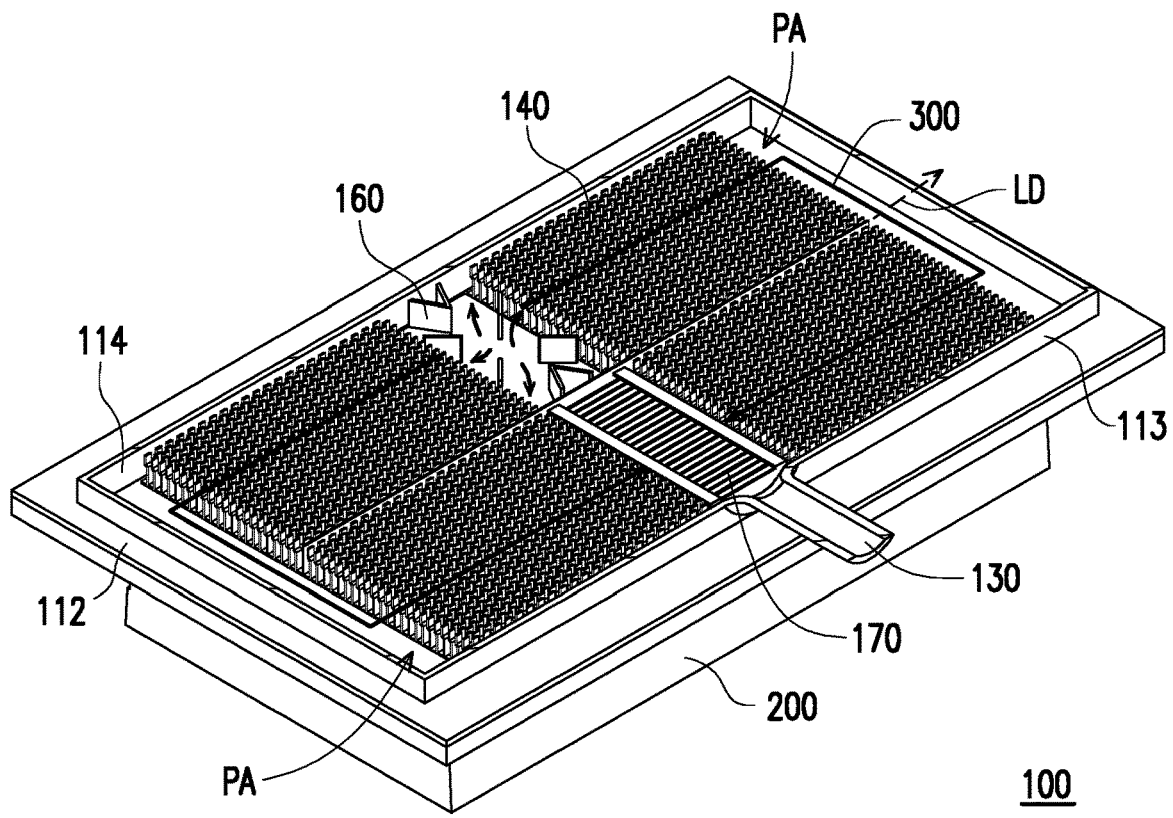
FIG. 1C illustrates a three-dimensional schematic diagram of a cross section A-A of the liquid-cooling device of FIG. 1A.
Figure 1D:
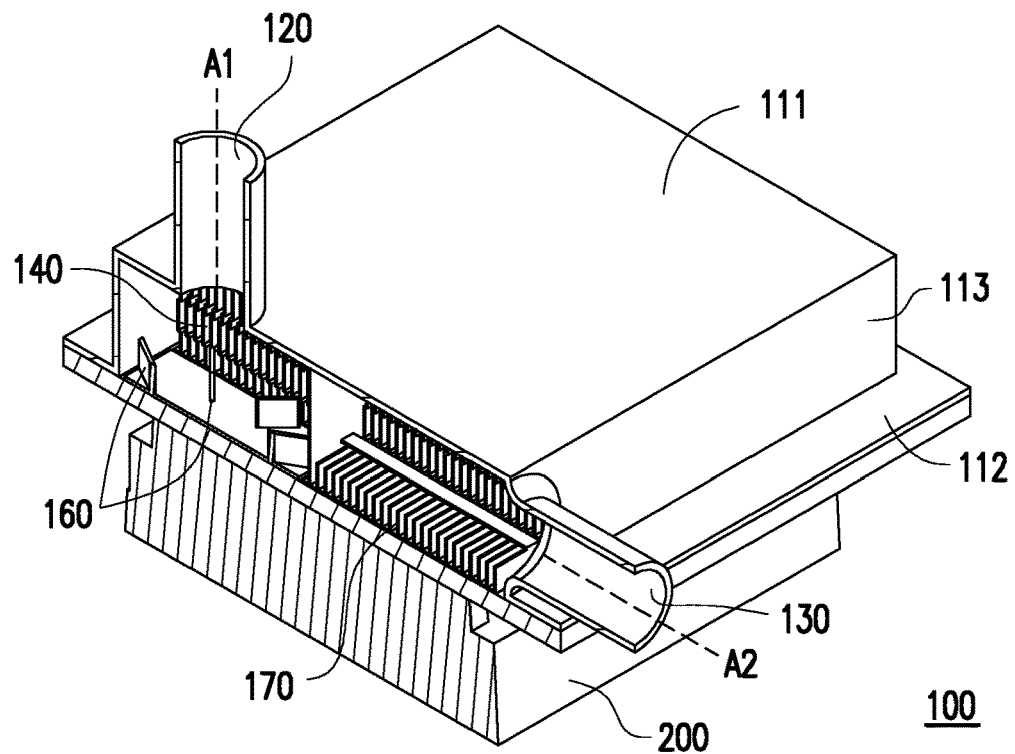
FIG. 1D illustrates a three-dimensional schematic diagram of a cross section B-B of the liquid-cooling device of FIG. 1A.
Figure 1E:
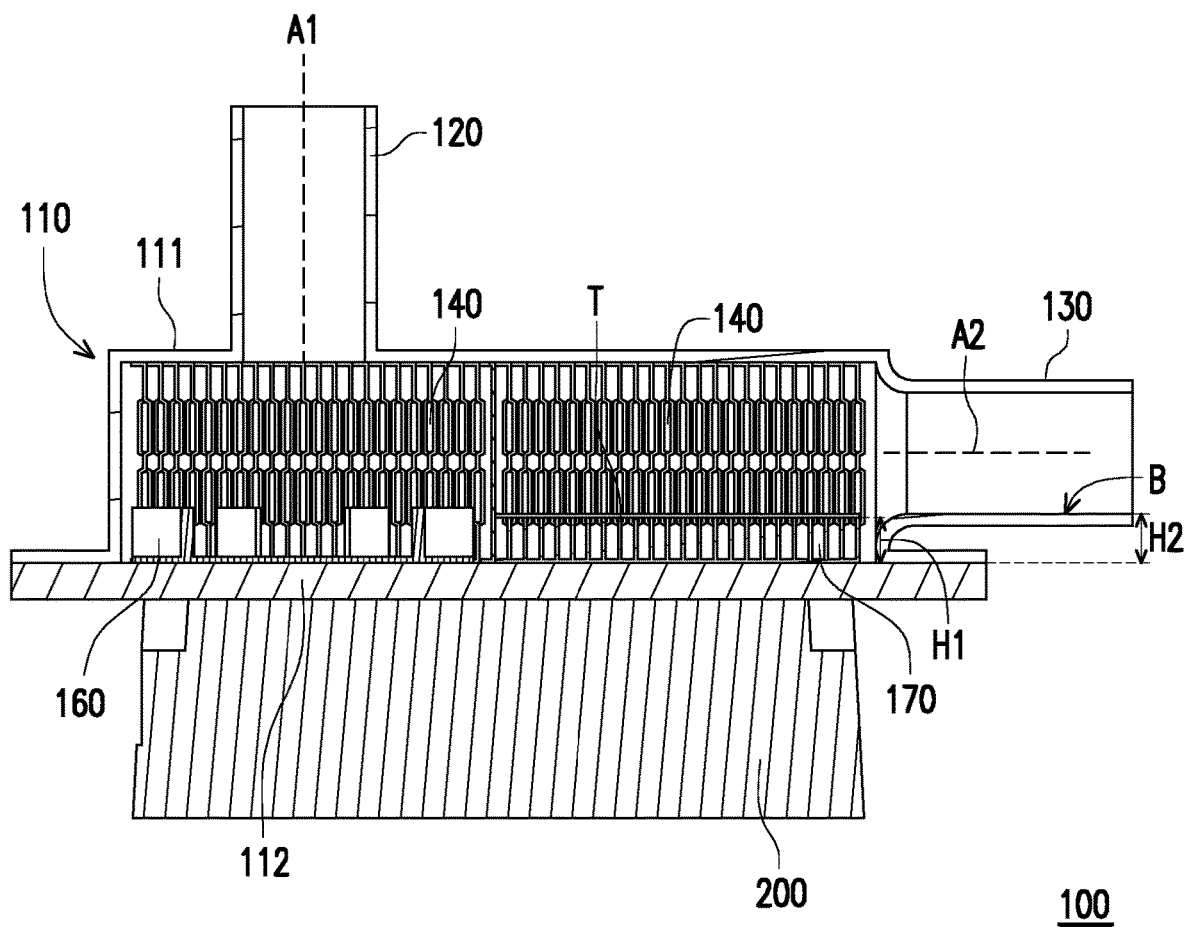
FIG. 1E illustrates a schematic plan side view of the liquid-cooling device of FIG. 1D.

FIG. 1A is an appearance schematic diagram of a liquid-cooling device according to one embodiment of the invention. FIG. 1B illustrates a perspective schematic diagram of the liquid-cooling device of FIG. 1A. FIG. 1C illustrates a three-dimensional schematic diagram of a cross section A-A of the liquid-cooling device of FIG. 1A. FIG. 1D illustrates a three-dimensional schematic diagram of a cross section B-B of the liquid-cooling device of FIG. 1A. FIG. 1E illustrates a schematic plan side view of the liquid-cooling device of FIG. 1D.

Referring to FIG. 1A, a liquid-cooling device 100 of the embodiment is suitable for being disposed on a heat source 200 so as to dissipate heat of the heat source 200 and to prevent the temperature of the heat source 200 from being excessively high. The heat source 200 is, for example, a light source (such as a light source made of a semiconductor component such as a light emitting diode or a laser) of a projector, a light valve, a central processing unit (CPU) of a computer, a graphics processing unit (GPU) or other electronic components which may generate high heat. The liquid-cooling device 100 contacts a surface of the heat source 200 and absorbs waste heat generated by the heat source 200 in a heat conduction manner, and when the heat source 200 is operated, a cooling effect can be realized, so that the operation of the heat source 200 is prevented from being influenced by too high temperature.

Referring to FIG. 1A to FIG. 1C, the liquid-cooling device 100 of the embodiment includes a shell 110, at least one water inlet pipe 120, at least one water outlet pipe 130, a plurality of heat-dissipating fins 140 and a partition plate 150.

The shell 110 includes a top plate 111, a bottom plate 112, a front plate 113, a rear plate 114 and two opposite side plates 115, and the top plate 111, the bottom plate 112, the front plate 113, the rear plate 114 and the two side plates 115 form an accommodating space AS. An outer surface of the bottom plate 112 is suitable for contacting the heat source 200.

In the embodiment, the number of at least one water inlet pipe 120 is, for example, one, and the water inlet pipe 120 is disposed on the top plate 111 of the shell 110 and communicated with the accommodating space AS. In addition, an axial direction A1 of the water inlet pipe 120 is, for example, perpendicular to the bottom plate 112 of the shell 110 and the heat source 200, and cooling liquid 300 is suitable for flowing into the accommodating space AS of the shell 110 from the water inlet pipe 120 along the axial direction A1. In addition, the water inlet pipe 120 is, for example, disposed on one side, close to the rear plate 114, of the top plate 111. In addition, in other embodiments, the number of the water inlet pipe may be multiple, and is determined according to the specification or requirement of the liquid-cooling device.

The number of the at least one water outlet pipe 130 is, for example, one, the water outlet pipe 130 is disposed on the front plate 113 of the shell 110 and communicated with the accommodating space AS, and an axial direction A2 of the water outlet pipe 130 is parallel to the bottom plate 112 of the shell 110, i.e., a spacing distance is provided between the bottom of the water outlet pipe 130 and the bottom plate 112 of the shell 110. In addition, the water outlet pipe 130, for example, is disposed at the center of the front plate 113, the axial direction A2 of the water outlet pipe 130 is intersected with the axial direction A1 of the water inlet pipe 120, and the cooling liquid 300 is suitable for flowing out of the shell 110 from the water outlet pipe 130 along the axial direction A2. In detail, an angle AN of 70 degrees to 110 degrees is provided between the axial direction A2 of the water outlet pipe 130 and the axial direction A1 of the water inlet pipe 120, which indicates that the axial direction A1 of the water inlet pipe 120 points to the bottom plate 112 of the shell 110.

The plurality of heat-dissipating fins 140 (two heat-dissipating fins in the embodiment) are disposed in the accommodating space AS and separated from one another. Each of the heat-dissipating fins 140 is connected between the top plate 111 and the bottom plate 112 of the shell 110, i.e., two ends of the heat-dissipating fins 140 respectively push against the top plate 111 and the bottom plate 112. Further, two heat-dissipating fins 140 are disposed on two sides of the water inlet pipe 120, so that each of the heat-dissipating fins 140 is separated from the water inlet pipe 120, and when the cooling liquid 300 flows in from the water inlet pipe 120, excessively high inflow pressure of the cooling liquid 300 caused by the direct contact with the heat-dissipating fins 140 may be avoided. Since the water inlet pipe 120 downwardly faces the bottom plate 112 of the shell 110, after the cooling liquid 300 passes through the water inlet pipe 120, the cooling liquid may enter the accommodating space AS and directly contacts the bottom plate 112, thereby producing an impact cooling effect. In addition, in the embodiment, each of the heat-dissipating fins 140 includes platy fins, columnar fins or fins in other shapes.

In other embodiments, each of the heat-dissipating fins is, for example, a multilayer structure, i.e., each of the heat-dissipating fins is not integrally formed but formed by stacking a plurality of independent heat-dissipating units.

The partition plate 150 is disposed in the accommodating space AS and disposed among the plurality of heat-dissipating fins 140. In detail, the partition plate 150 is disposed among the two heat-dissipating fins 140 in a penetrating manner, a length direction LD of the partition plate 150 is parallel to the front plate 113 and the rear plate 114 of the shell 110, a distance from the partition plate 150 to the front plate 113 is equal to a distance from the partition plate 150 to the rear plate 114, and two flow passages PA of a U-shaped loop are formed in the accommodating space AS. The length direction LD of the partition plate 150 is also respectively perpendicular to the axial directions A2 and A1 of the water outlet pipe 130 and the water inlet pipe 120, so that the two flow passages PA are in a symmetric form and have the same flow rate of cooling liquid 300. In addition, the partition plate 150 is staggered to the water inlet pipe 120, when the cooling liquid 300 enters the shell 110 from the water inlet pipe 120 along the axial direction A1, the cooling liquid 300 first contacts the bottom plate 112 and then flows into the two flow passages PA along directions respectively facing two opposite side plates 115 under the obstruction of the rear plate 114 and the partition plate 150, and the cooling liquid 300 flows along the two flow passages PA of the U-shaped loop and passes through the corresponding heat-dissipating fins 140, thereby achieving an effect of flow distribution. Finally, the cooling liquid 300 is converged between the front plate 113 and the partition plate 150, and leaves the shell 110 via the water outlet pipe 130 along the axial direction A2, thereby completing one-time flow cycle of the cooling liquid 300.

Referring to FIG. 1C to FIG. 1E, the liquid-cooling device 100 includes a plurality of guiding fins 160 and at least one auxiliary fin 170. The plurality of guiding fins 160 are disposed between the partition plate 150 and the rear plate 114 of the shell 110. The plurality of guiding fins 160 are aligned to the water inlet pipe 120 and are in a radiation shape. The plurality of guiding fins 160 obliquely extend towards the two flow passages, and are used for guiding the cooling liquid 300 to respectively forwardly flow into the two flow passages PA, the cooling liquid 300 is prevented from generating phenomena such as turbulent flow, back flow and the like due to the collision with the rear plate 114, the partition plate 150 as well as the heat-dissipating fins 140, which goes against the flow of the cooling liquid 300 and also influences the heat dissipation effect.

In the embodiment, the number of at least one auxiliary fin 170 is one, and the auxiliary fin is disposed on the bottom plate 112 and located between the partition plate 150 and the front plate 113. A thickness of the auxiliary fin 170 is smaller than a thickness of each of the heat-dissipating fins 140. The auxiliary fin 170 is aligned to the water outlet pipe 130, i.e., the auxiliary fin 170 is disposed between the two heat-dissipating fins 140. In addition, since a vertical height H1 of a top portion T of the auxiliary fin 170 relative to the bottom plate 112 is equal to or less than a vertical height H2 of a bottom B of the water outlet pipe 130 relative to the bottom plate 112, and when the cooling liquid 300 passes through each of heat-dissipating fins 140 to contact the auxiliary fin 170, the auxiliary fin 170 does not prevent the cooling liquid 300 from flowing towards the water outlet pipe 130. In detail, the auxiliary fin 170 is mainly used for improving the heat conduction performance of the bottom plate 112 located between the partition plate 150 and the front plate 113, when the cooling liquid 300 flows to the bottom plate 112 close to the water outlet pipe 130 along the two flow passages PA, the cooling liquid 130 already absorbs waste heat transferred from the heat source 200 to the two heat-dissipating fins 140 to be heated up, so that the heat dissipation effect of the cooling liquid 300 on the bottom plate 112 at the position is already reduced, which leads to the concentration of the waste heat of the heat source 200 on the bottom plate 112 at the position, thereby generating high temperature. Through the auxiliary fin 170, the heat conduction performance of the bottom plate 112 at the position may be further improved, and the waste heat may be prevented from being concentrated to cause the high temperature.

Other embodiments will be listed below for illustration. It must be noted here that the following embodiments use the component reference number and part of the contents of the foregoing embodiments, the same reference numbers are used to refer to the same or like parts, and the description of the same technical content is omitted. The description of the omitted part may refer to the foregoing embodiments and is not repeated in the following embodiments.

Figure 2A:
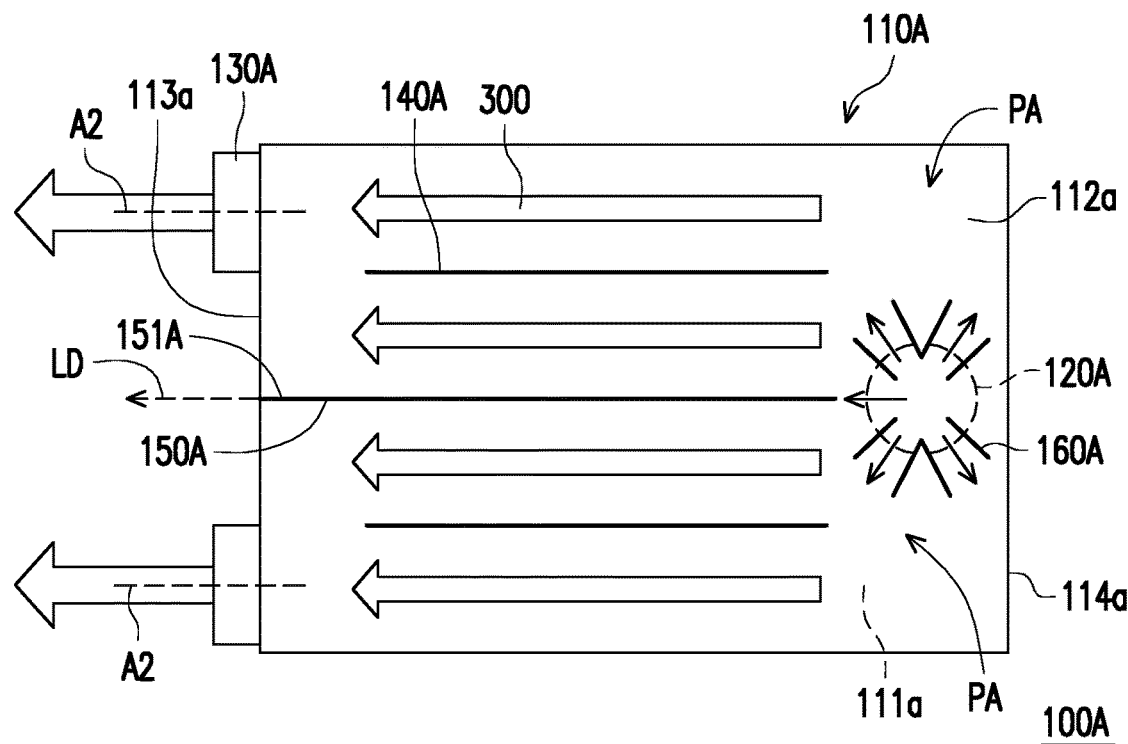
FIG. 2A is a schematic plan view of a liquid-cooling device according to another embodiment of the invention.

FIG. 2A is a schematic plan view of a liquid-cooling device according to another embodiment of the invention. Referring to FIG. 2A, a liquid-cooling device 100A of the embodiment differs from the liquid-cooling device 100 of the aforementioned embodiment in that:

The number of at least one water outlet pipe 130A of the liquid-cooling device 100A of the embodiment is two, and the two water outlet pipes 130A are disposed on a front plate 113a of the shell 110A in a spacing manner. A water inlet pipe 120A is disposed on one side, close to the rear plate 114a, of the top plate 111a, and a partition plate 150A is disposed between two heat-dissipating fins 140A in a penetrating manner to form two flow passages PA. A length direction LD of the partition plate 150A is parallel to an axial direction A2 of each water outlet pipe 130A, and an end portion 151A of the partition plate 150A pushes against a front plate 113a of the shell 110A, and is located between the two water outlet pipes 130A. Further, a plurality of guiding fins 160A are aligned to the water inlet pipe 120A and disposed on the bottom plate 112a in a radiation shape, and obliquely extend respectively towards the two flow passages PA. In brief, cooling liquid 300 enters the shell 110A from the water inlet pipe 120A, and generates an impact cooling effect on the bottom plate 112a, then the cooling liquid 300 is guided by a plurality of guiding fins 160A to respectively flow into the two flow passages PA, and to flow towards the corresponding water outlet pipes 130A so as to leave the shell 110A.

Figure 2B:
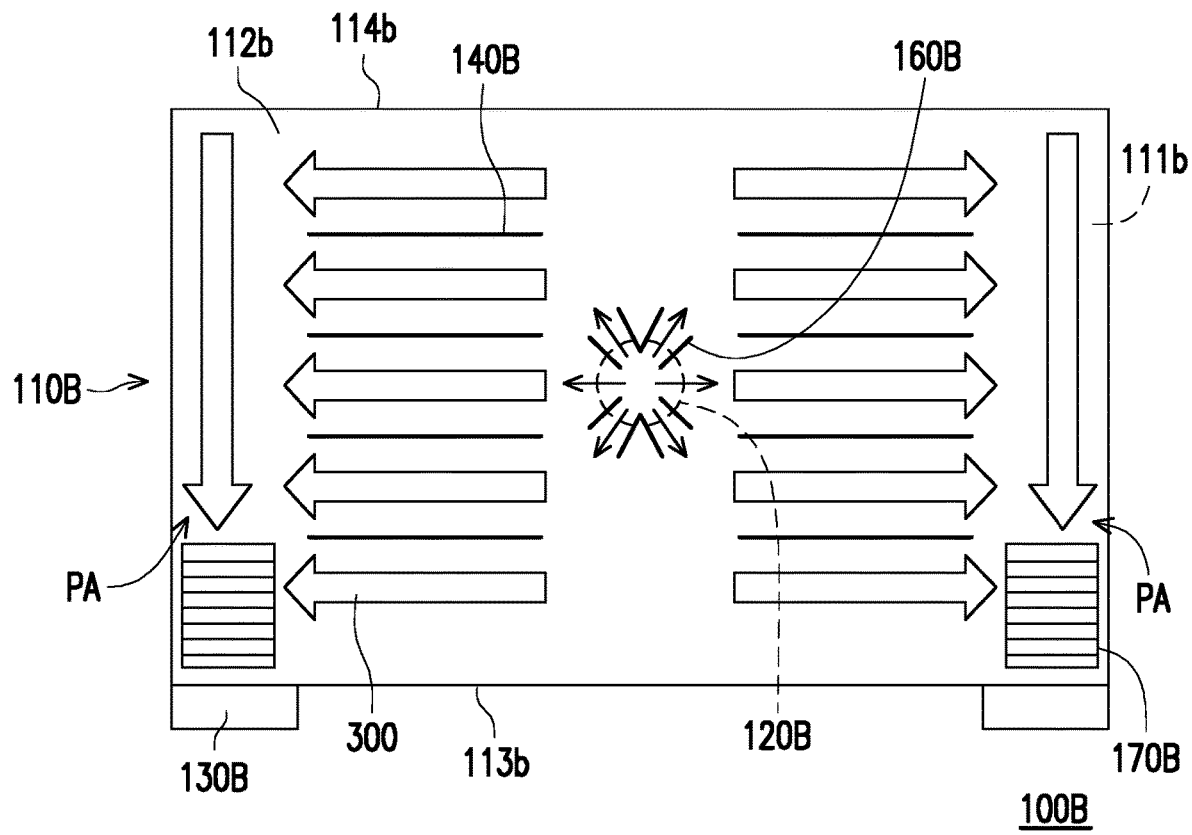
FIG. 2B is a schematic plan view of a liquid-cooling device according to another embodiment of the invention.

FIG. 2B is a schematic plan view of a liquid-cooling device according to another embodiment of the invention.

A liquid-cooling device 100B of the embodiment is similar to the liquid-cooling device 100A of the aforementioned embodiment and differs in that:

The liquid-cooling device 100B of the embodiment is provided with two water outlet pipes 130B, and the two water outlet pipes 130B are disposed on a front plate 113b of the shell 110B in a spacing manner. A water inlet pipe 120B is disposed at the center of a top plate 111b. A plurality of guiding fins 160B is aligned to a water inlet pipe 120B and disposed on a bottom plate 112b in a radiation shape and obliquely extend respectively towards the two flow passages PA of the shell 110B. Two auxiliary fins 170B are disposed on the bottom plate 112b and located between a rear plate 114b and the front plate 113b. Further, the two auxiliary fins 170B are disposed on the outer sides of the plurality of heat-dissipating fins 140B and respectively aligned to the two water outlet pipes 130B, and are used for improving the heat dissipation effect of the bottom plate 112b. In brief, the cooling liquid 300 enters the shell 110B from the water inlet pipe 120B, and generates an impact cooling effect on the center of the bottom plate 112a, then the cooling liquid 300 is guided by a plurality of guiding fins 160B to flow into two flow passages PA and to flow towards the corresponding water outlet pipes 130B so as to leave the shell 110B. The liquid-cooling device 100B of the embodiment may not be provided with a partition plate, and may use the water inlet pipe 120B and the guiding fins 160B to enable the cooling liquid 300 to respectively flow towards the two flow passages PA after entering the shell 110B.

Based on the above, according to the liquid-cooling device of the invention, the angle of 70 degrees to 110 degrees is provided between the axial direction of at least one water outlet pipe and the axial direction of at least one water inlet pipe, therefore, when the cooling liquid enters the shell from at least one water inlet pipe, an impact cooling effect can be produced on a part of the bottom plate of the shell, thereby improving the heat dissipation effect. In addition, by configuring two flow passages, the cooling liquid is better distributed when in flow, so that the cooling liquid rapidly passes through each of the heat-dissipating fins and bring away the waste heat, and the heated-up cooling liquid finally leaves the shell via at least one water outlet pipe, thereby achieving an objective of improving the heat conduction performance of the liquid-cooling device.

Further, the liquid-cooling device of the invention is also provided with the guiding fins and the auxiliary fins, the guiding fins can be used for preventing the cooling liquid from generating phenomena such as turbulent flow, back flow and the like due to the collision with the rear plate, the partition plate as well as the heat-dissipating fin in the flow process. The auxiliary fin is used for improving the heat conduction performance of the bottom plate, and the waste heat of the heat source is prevented from being concentrated in a specific area of the bottom plate to generate high temperature. Comparing embodiments of the invention with the prior art by simulation, with the same heat source and the same appearance size, the liquid-cooling device of the invention reduces the heat resistance by 14% and also reduce the voltage drop by 7% compared with a known liquid-cooling device.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A liquid-cooling device, comprising:
a shell comprising: a top plate, a bottom plate, a front plate, a rear plate and two opposite side plates, wherein the top plate, the bottom plate, the front plate, the rear plate and the two side plates form an accommodating space;
at least one water inlet pipe disposed on the top plate of the shell and communicated with the accommodating space;
at least one water outlet pipe disposed on the front plate of the shell and communicated with the accommodating space;
a plurality of heat-dissipating fins disposed in the accommodating space;
a partition plate disposed in the accommodating space, wherein the partition plate forms at least two flow passages in the accommodating space; and
at least one auxiliary fin which is disposed on the bottom plate,
wherein a vertical height of the top of the at least one auxiliary fin relative to the bottom plate is equal to or less than a vertical height of the bottom of the at least one water outlet pipe relative to the bottom plate.

2. The liquid-cooling device of claim 1, wherein an angle of 70 degrees to 110 degrees is provided between an axial direction of the at least one water outlet pipe and an axial direction of the at least one water inlet pipe, and the partition plate is staggered to the at least one water inlet pipe.

3. The liquid-cooling device of claim 1, wherein a length direction of the partition plate is perpendicular to an axial direction of the at least one water outlet pipe.

4. The liquid-cooling device of claim 1, wherein the number of the at least one water outlet pipe is two, the length direction of the partition plate is parallel to the axial direction of each of the two water outlet pipes, and an end portion of the partition plate abuts the front plate and is located between the two water outlet pipes.

5. The liquid-cooling device of claim 1, wherein the liquid-cooling device further comprises a plurality of guiding fins which is disposed between the partition plate and the rear plate, and aligned to opposite to the at least one water inlet pipe.

6. The liquid-cooling device of claim 5, wherein the plurality of guiding fins are in a radiation shape, and extend respectively towards the at least two flow passages, and when cooling liquid enters the shell from the at least one water inlet pipe, the cooling liquid is guided by the plurality of guiding fins respectively to the at least two flow passages, passes through the plurality of corresponding heat-dissipating fins, and leaves the shell via the at least one water outlet pipe.

7. The liquid-cooling device of claim 1, wherein the at least one auxiliary fin is located between the partition plate and the front plate, and the at least one auxiliary fin is aligned to the at least one water outlet pipe.

8. The liquid-cooling device of claim 1, wherein an axial direction of the at least one water inlet pipe is perpendicular to the bottom plate of the shell, an axial direction of the at least one water outlet pipe is parallel to the bottom plate of the shell, and the bottom plate is suitable for contacting a heat source.

9. The liquid-cooling device of claim 1, wherein each of the plurality of heat-dissipating fins is connected between the top plate and the bottom plate of the shell.

10. The liquid-cooling device of claim 1, wherein each of the plurality of heat-dissipating fins comprises platy fins or columnar fins.

11. A liquid-cooling device, comprising:
- a shell comprising a top plate, a bottom plate, a front plate, a rear plate and two opposite side plates, wherein the top plate, the bottom plate, the front plate, the rear plate and the two side plates form an accommodating space;
- at least one water inlet pipe disposed on the top plate of the shell and communicated with the accommodating space;
- two water outlet pipes disposed on the front plate of the shell and communicated with the accommodating space;
- a plurality of heat-dissipating fins disposed in the accommodating space; and
- at least two auxiliary fins which are disposed on the bottom plate,
- wherein a vertical height of the top of the two auxiliary fins relative to the bottom plate is equal to or less than a vertical height of the bottom of the two water outlet pipes relative to the bottom plate.

12. The liquid-cooling device of claim 11, wherein at least two flow passages are formed in the accommodating space, the at least two flow passages respectively correspond to the two water outlet pipes, and an angle of 70 degrees to 110 degrees is provided between an axial direction of the two water outlet pipes and an axial direction of the at least one water inlet pipe.

13. The liquid-cooling device of claim 11, wherein the liquid-cooling device further comprises a plurality of guiding fins aligned to the at least one water inlet pipe, and the at least one water inlet pipe is disposed at the center of the top plate.

14. The liquid-cooling device of claim 12, wherein the plurality of guiding fins are in a radiation shape, and extend respectively towards the at least two flow passages, and when cooling liquid enters the shell from the at least one water inlet pipe, the cooling liquid is guided by the plurality of guiding fins respectively to the at least two flow passages, passes through the plurality of corresponding heat-dissipating fins, and leaves the shell via the two water outlet pipes.

15. The liquid-cooling device of claim 11, wherein the at least two auxiliary fins are located between the rear plate and the front plate, and the at least two auxiliary fins are disposed on the outer sides of the plurality of heat-dissipating fins and are respectively aligned to the two water outlet pipes.

16. The liquid-cooling device of claim 11, wherein the axial direction of the at least one water inlet pipe is perpendicular to the bottom plate of the shell, the axial direction of the two water outlet pipes is parallel to the bottom plate of the shell, and the bottom plate is suitable for contacting a heat source.

17. The liquid-cooling device of claim 11, wherein each of the plurality of heat-dissipating fins is connected between the top plate and the bottom plate of the shell.

18. The liquid-cooling device of claim 11, wherein each of the plurality of heat-dissipating fins comprises platy fins or columnar fins.

* * * * *